United States Patent
Bakowski et al.

[11] Patent Number: 6,002,159
[45] Date of Patent: *Dec. 14, 1999

[54] SIC SEMICONDUCTOR DEVICE COMPRISING A PN JUNCTION WITH A VOLTAGE ABSORBING EDGE

[75] Inventors: Mietek Bakowski, Skultuna; Ulf Gustafsson, Linkoping; Kurt Rottner, Kista; Susan Savage, Jarfalla, all of Sweden

[73] Assignee: ABB Research Ltd., Zurich, Switzerland

[*] Notice: This patent issued on a continued prosecution application filed under 37 CFR 1.53(d), and is subject to the twenty year patent term provisions of 35 U.S.C. 154(a)(2).

[21] Appl. No.: 08/683,059

[22] Filed: Jul. 16, 1996

[51] Int. Cl.$^6$ .................................................. H01L 23/58
[52] U.S. Cl. .............................. 257/493; 257/487; 257/77
[58] Field of Search ....................... 257/77, 487, 491–495

[56] References Cited

U.S. PATENT DOCUMENTS

| | | | |
|---|---|---|---|
| 4,573,066 | 2/1986 | Whight | 257/495 |
| 4,648,174 | 3/1987 | Temple et al. | 437/20 |
| 4,667,393 | 5/1987 | Ferla et al. | 29/576 |
| 4,672,738 | 6/1987 | Stengl et al. | 29/576 |
| 4,927,772 | 5/1990 | Arthur et al. | 437/6 |
| 4,947,218 | 8/1990 | Edmond et al. | 257/77 |
| 5,233,215 | 8/1993 | Baliga | 257/490 |

FOREIGN PATENT DOCUMENTS

| | | |
|---|---|---|
| 06268202 | 9/1994 | Japan . |
| WO 95/32524 | 11/1995 | WIPO . |
| WO 96/03774 | 2/1996 | WIPO . |
| WO 97/08754 | 3/1997 | WIPO . |

OTHER PUBLICATIONS

R. Stengl, et al., "Variation of Lateral Doping—A New Concept to Avoid High Voltage Breakdown of Planar Junctions," IEDM, Dec. 1985, pp. 154–157.

Neudeck et al., 2000 V 6H–SiC P–N Junction Diodes Grown By Chemical Vapor Deposition, Appl. Phys. Lett. 64 (11), Mar. 14, 1994, pp. 1386–1388.

Bhatnagar et al., Comparison of 6H–SiC, 3C–SiC, and Si For Power Devices, IEEE Transactions on Electron Devices, vol. 40, No. 3, Mar. 1993, pp. 645–655.

*Primary Examiner*—John Guay
*Attorney, Agent, or Firm*—Pollock, Vande, Sande & Amernick

[57] ABSTRACT

A semiconductor component including a silicon carbide substrate. A pn junction includes doped layers of the substrate. The pn junction includes at a surface of the substrate a low doped first conductivity type layer and at a portion of the surface of the substrate a highly doped second conductivity type layer. An edge termination region of the pn junction laterally surrounds the pn junction provided at an edge of at least one of the layers of the pn junction. The edge termination region includes zones of the second conductivity type located at an edge of the highly doped second conductivity type layer. A charge content of the zones decreases toward an edge of the edge termination region in accordance with at least one characteristic selected from the group consisting of a stepwise or continuously decreasing total charge towards an outer border of the edge termination region and a decreasing effective sheet charge density toward an outer border of the edge termination region. An outermost zone of the edge termination region is completely depleted at full design voltage.

12 Claims, 2 Drawing Sheets

SIC SEMICONDUCTOR DEVICE COMPRISING A PN JUNCTION WITH A VOLTAGE ABSORBING EDGE

TECHNICAL FIELD

The invention is related to a semiconductor component with silicon carbide as base material, where the component comprises at least one pn junction and where a risk of voltage breakdown due to a strong electric field at the edge of the junction is reduced as the pn junction contains an edge termination with a decreasing charge content in the direction away from the symmetry axis of the component and situated preferably on a highly doped side of the pn junction.

BACKGROUND ART

Semiconductor components based on silicon carbide as base material are continuously developed to be used in connection with high temperatures, high power applications and under high radiation conditions. Under such circumstances conventional semiconductors do not work satisfactorily. Evaluations indicate that SiC semiconductors of power MOSFET-type and diode rectifiers based on SiC would be able to operate over a greater voltage and temperature interval, e.g. up to 650–800° C., and show better switching properties such as lower losses and higher working frequencies and nevertheless have a volume 20 times smaller than corresponding silicon components. These possible improvements are based on the favourable material properties that silicon carbide possesses in relation to silicon, such e.g. a higher breakdown field (up to 10 times higher than silicon), a higher thermal conductivity (more than 3 times higher than silicon) and a higher energy band gap (2.9 eV for 6H-SiC, one of the crystal structures of siC).

As SiC semiconductor technology is relatively young and in many aspects immature, there are many critical manufacturing problems that are to be solved until SiC semiconductor devices may be realized experimentally and manufacturing in a large number may become a reality. This is especially true of components intended for use in high-power and high-voltage applications.

One of the difficulties to overcome when manufacturing high voltage diodes or other types of semiconductor components comprising a voltage absorbing pn junction is to produce a proper junction termination at the edge of the junction. The electric field at the periphery of the junction is normally enhanced compared to the electric field in the bulk of the junction. This field increase at the periphery of the junction may be further reinforced in the presence of surface charge.

A high electric field at the edge of the pn junction implies a great risk of voltage breakdown or flash-over at the edge of the junction as well as giving rise to an instability of the blocking voltage known as voltage drift.

To avoid said disadvantages it becomes very important to reduce the field concentration, where the junction reaches the surface. Combined with efforts to passivate the surface of the component, measures are taken to flatten out the electric field at the surface e.g. by acting on how the pn junction emerges at the surface. As an example it is known from silicon power components to lap (grind, sandblast, etch) the surface of the edge to a certain angle in relation to the pn junction to thereby flatten out the field. Another known technique is to gradually decrease the charge content on the highly doped side of the junction, such that the charge content of the highly doped layer is reduced towards the outermost edge of the junction (so called Junction Termination Extension, JTE). The methods, known from silicon technology, used to achieve a JTE of an Si component are difficult or almost impossible to apply to components based on silicon carbide due to the great hardness of the material and extremely low diffusivity of proper SiC dopants. As an example, doping through diffusion is not feasible for SiC, as diffusion coefficients are negligible below 2270° K. Also, ion implantation of doping elements, a common technique when manufacturing Si components, is difficult to master and not yet fully developed for SiC. Hence, many of the problems reminiscent of those prevalent at the beginning of the development of corresponding silicon components to be solved when developing semiconductor components from SiC have not been solved as yet for pn junctions in SiC.

High voltage diodes from 6H-SiC with epitaxially formed pn and Schottky junctions have been made experimentally (see e.g. M. Bhatnagar and B. J. Baliga, IEEE Trans. Electron Devices, vol. 40, no. 3 pp 645–655, March 1993 or P. G. Neudeck, D. J. Larkin, J. A. Powell, L. G. Matus and C. S. Salupo, Appl. Phys. Lett. vol 64, No 11, Mar. 14, 1994, pp 1386–1388). Some of the problems related to SiC devices have thus been solved, but no reliable solution to the problems connected with electric field concentration at the edges of the junction has been presented as yet.

The electric field may be reduced at the edge of the pn junction by applying a semi-isolating layer to the edge of the junction of an SiC component. Such a solution is described in document PCT/SE94/00482.

Any method or device to accomplish a semiconductor component corresponding to the principle of Junction Termination Extension at a pn junction composed of Si is not publicly known for a component, where SiC constitutes the base material of the junction. Solutions for arriving at SiC components comprising pn junctions with JTEs are described in the unpublished patent application U.S. Ser. No. 08/520,689, which is hereby included in this description by reference. The solutions described there involve stepwise decreasing charges of the JTE towards the edge of the JTE by use of an etch down technique, epitaxial regrowth or ion implantation in order to control the surface doping and surface fields. The present invention aims at describing a voltage absorbing edge at a pn junction with a JTE structure of an SiC component where the pn junction has a planar structure.

The term SiC is used in the following text to refer to any of the principal crystal polytypes of this material known as 6H, 4H, 2H, 3C and 15R.

DESCRIPTION OF THE INVENTION

One aspect of the invention is composed of a planar structure semiconductor component, which comprises a pn junction, where both a p-conducting layer and an n-conducting layer of the pn junction constitute doped silicon carbide layers and where the edge of the higher doped conducting layer of the pn junction exhibits a charge profile with a stepwise or uniformly decreasing total charge and/or effective sheet charge density from an initial value at the periphery of a main junction area to a zero or almost zero total charge at the outermost edge of a junction extension following a radial direction from the central part of the main junction towards said outermost edge.

Other aspects of the invention further comprises methods for producing said SiC semiconductor component with said decreasing charge profile.

By manufacturing an SiC semiconductor component with the features described, the concentration of the electric field, when a high reverse voltage is applied to the pn junction, is eliminated as the electric field is flattened out along the extended edge termination. A low electric field in the lateral direction is achieved. Hence, the risk of a voltage breakdown at the edge of the main junction before a breakdown somewhere inside the bulk of the main junction is reduced. By forming the edges of a pn junction of SiC material with a structure similar to a Junction Termination Extension (JTE) of prior art silicon devices as described according to the invention, the reverse voltage over the junction may be considerably increased (3 times and more) before a breakdown occurs, thus making it possible to produce an SiC pn junction with a JTE withstanding a reverse voltage of 4.5 kV or more.

Furthermore the reliability and long term stability are improved. This is due to the reduction of the electric field in the SiC material at the periphery of the junction. The maximum surface electric field must be reduced by at least one order of magnitude as long as the passivation schemes known from Si technology are used. Taking the measures relieves the stress inflicted on the passivation and isolation of the junction.

The SiC semiconductor component is manufactured according to the invention by means of one of the alternative methods described below which have in common that the junction has decreasing total charge and/or effective sheet charge density towards the outer edge.

One way to arrive at a JTE with the properties wanted would be to use ion implantation of the surface surrounding the edge of the main pn junction area in discrete steps by means of a lithography and masking technique, where zones surrounding each other and surrounding the defined main pn junction area, by means of ion implantation are doped to have decreasing total charge and/or effective sheet charge density in the direction of the edge of the so formed JTE (FIG. 1). If this is done in discrete steps, each zone fully implanted to its wanted charge content, problems would arise with the alignment of the masks. Although a JTE would be arrived at, misalignment of the masks between the steps of the procedure would cause a distribution of the electric field having peaks as shown in the example according to FIG. 2, where the electric field peaks of a 2 μm overlap of zones having 100 μm width each is illustrated for a JTE of a planar SiC pn junction developed by the said method. Similar field peaks will appear in the case of gaps between the zones being unimplanted due to mask misalignment.

A low lateral electric field at an interface of a JTE surface to a passivation layer is vital to the proper function of the JTE. Unnecessary electric field peaks may be detrimental to the short- and long-term stability of the component. Hence, one purpose of the invention is to establish a component with a pn junction of SiC where electric field peaks between implanted zones of a JTE are reduced to a minimum.

A first method 1° of achieving the component according to the invention is arrived at by starting with a silicon carbide wafer of a planar structure comprising a doped layer of a first conducting type. On the plane surface of the wafer, a doped layer of a second conducting type is formed, for example by ion implantation. These two layers constitute the defined working area of a pn junction, here called the main junction. A formation of a number of doped zones by means of ion implantation of the second conducting type at the surface of the wafer in its first conducting type region and surrounding the main junction is carried through. At first the entire device area of the component including the prospective implanted zones is implanted to a dose determined.

After this step the prospective outermost JTE zone is masked, whereupon the remaining unmasked area of the device is ion implanted, in that the second JTE zone from the edge receives its proper dose. The masking and implantation process is then continued in the wanted number of steps until finally the region constituting the pn junction layer of the second conducting type is implanted to its final dose. By this method the main pn junction and the JTE zones receive their respective doses by way of a procedure where the final dose of the respective zone is achieved by doses added during the consecutive steps of implantation. As a result each JTE zone will have a decreasing total charge and/or effective sheet charge density towards the edge of the junction in a proportion required to obtain a desired effect on the surface field. Of course it is as well possible to have the main junction masked all the time during the implantation steps for forming the JTE. This may be preferred.

The method described can also be performed in a reversed way, in a method 2°. The area exposed to consecutive implantations is increased step-wise by extending the opening of the implantation mask by removal of the inner regions of the mask, covering areas corresponding to prospective JTE zones, successively, such that the innermost zone is exposed for every new implantation step, while the outermost zone is only implanted once. The total charge implanted will thus decrease towards the edge of the termination also in this example.

Due to the costs involved and the complexity of the process if many process steps are used, the methods disclosed so far for realizing a JTE give rise to a limited number of discrete zones having different charge content and/or effective sheet charge density. Without the diffusion of dopants the disclosed methods will still suffer from nonhomogeneities in the charge distribution and as a consequence peaks in the electric field distribution occur. Anyhow, said methods show a way of accomplishing JTEs of a pn junction for SiC. But for further reduction of the height of the peaks the number of discrete zones has to be increased. The effect of the number of zones on the field reduction and field uniformity saturates, however, with an increasing number of zones. Method 1° and 2° described give an example of a self-aligning method as the linearisation of the mask between the implantation steps, where the final total charge and/or effective sheet charge density of each JTE zone is built step by step, is not crucial using said methods, as would be the case if the JTE zones were implanted one by one in a single-step implantation procedure per JTE zone.

According to a third aspect of the invention, 3°, a method for establishing zones with a quasi-homogeneous decreasing total charge and/or effective sheet charge density towards the edge is disclosed. This is achieved by a single-step or a multi-step ion implantation of the device, where the region of the prospective JTE is covered with a mask where discrete zones with decreasing total charge are formed by open holes, lines or curves of the mask in a pattern defining the areas of the JTE to be implanted in a proper way. This may then be achieved by having greater areas of the openings or with openings much more dense in the innermost portion of the JTE compared to the condition at the edge of the JTE. Between these two limits the mask pattern is such that the areas exposed during the implantation are evenly decreasing. A smooth change in the effective doping and resulting volume and surface fields is thus achieved. The electric field peaks at the boundaries of the small implanted zones are now of low values.

The advantages arrived at by an SiC component according to the invention are a realization of a reliable JTE withstanding a blocking voltage of more than 4.5 kV, and the component being characterized by a low surface field and a high immunity against surface charge.

The JTE as described above and as defined in the claims is capable of handling surface charge of both polarities up to a charge density of $2 \cdot 10^{12}$ cm$^{-2}$. Even higher densities of positive surface charge (for an n-type surface layer) can be tolerated but will require a redesigning of the charge densities in the JTE zones. Basically the doping levels of the JTE zones will then have to be increased, which causes an increase of the characteristic sheet charge density $Q_0$, which is the effective sheet charge density of the highest doped JTE zone, where said charge density $Q_0$ has to be selected depending on the voltage for which the junction is designed.

BRIEF DESCRIPTION OF THE DRAWINGS

FIG. 5a shows an example of the relation between total charge content of the respective zone of the JTE of FIG. 1, while

FIG. 6b illustrates the electric field concentration laterally over a JTE arrived at with a device according to FIG. 6a.

DESCRIPTION OF EMBODIMENTS

The invention will be described in a number of embodiments with reference to the drawings.

Figure 1:
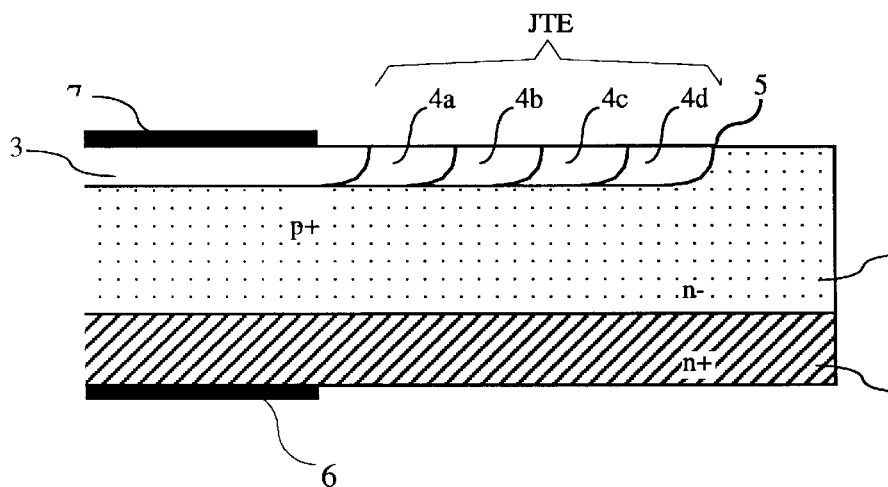
FIG. 1 schematically describes a section through a pn junction of a planar semiconductor device on a wafer of SiC material where four zones have decreasing charge content and surround a p-doped anode to form a Junction Termination Extension, JTE, of said junction.
Figure 2:
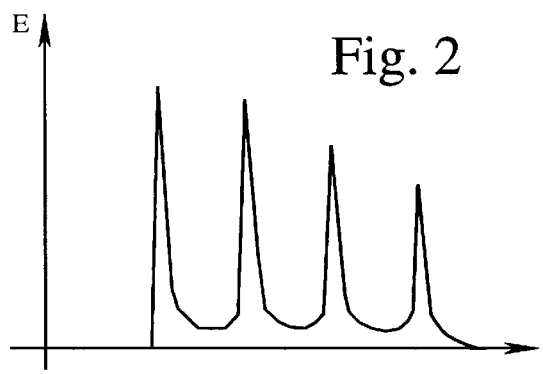
FIG. 2 illustrates the electric field concentration laterally over the JTE for the four-zone JTE of FIG. 1 produced without use of a self-aligning masking procedure.
Figure 3:
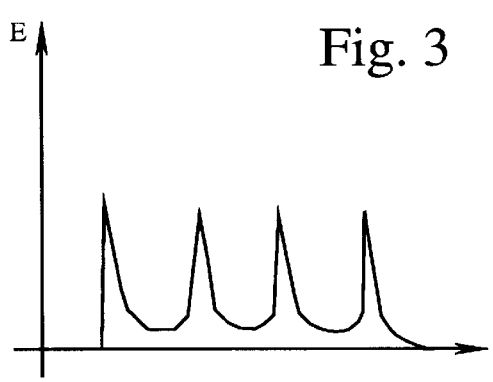
FIG. 3 shows the same electric field as that of FIG. 2, where one of the self-aligning methods 1° or 2° has been used to establish a four zone JTE.

FIG. 1 illustrates an example of an SiC semiconductor device having a JTE according to the invention. The semiconductor is exemplified by a diode manufactured in SiC. The component of FIG. 1 is built on a substrate of SiC consisting of a highly doped (n$^+$), n-conducting, layer 1 forming a cathode of the diode. On top of this n$^+$-layer 1, a first lower doped (n$^-$), n-conducting, layer 2 is established. These two n-conducting layers 1, 2 compose a wafer of a first conducting type of SiC semiconducting material. At the top of the lower doped n-conducting layer 2 an anode formed by a second, high doped, (p$^+$) p-conducting layer 3 is arranged facing the surface of the wafer, thus establishing a planar surface of the wafer. Contacts 6 and 7 are contacting the cathode and anode, respectively, of the diode. The first layer (n-conducting) and the second layer (p-conducting) compose a pn-junction, where the interface between the first, n-conducting, layer 2 and the second, p-conducting, layer 3 define the working area of the pn-junction, here called the main junction, which as far as yet described does not comprise any junction termination extension, JTE. In FIG. 1 is shown a pn junction with a four-zone JTE forming an extension of the main junction in the lateral direction, each zone 4a–4d surrounding the second conducting layer 3 and being of the same conducting type as the second conducting layer 3. The outermost zone 4d at its end outwards from the junction thus forming the outermost edge 5 of JTE. The charge content and/or the effective sheet charge density of the respective zone 4a–4d is stepwise decreasing in the direction towards the JTE edge 5.

Figure 4A:
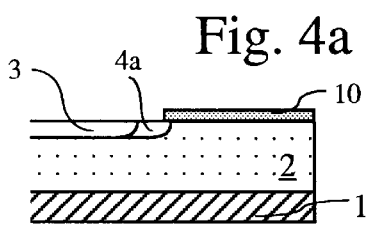
FIGS. 4a–4d show an example of the masking and implantation steps of forming a JTE according to the aspect of the invention, where method 2° is used.
Figure 4C:
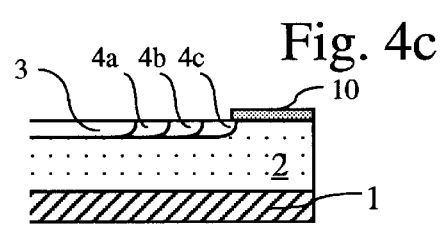
Figure 4B:
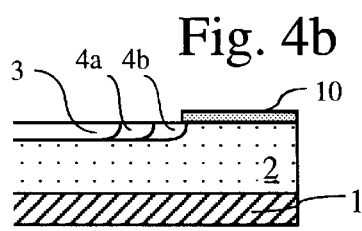
Figure 4D:
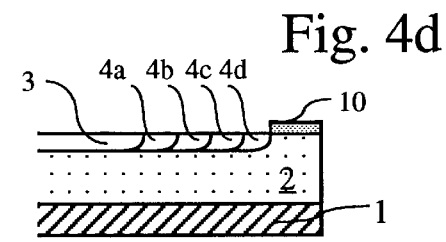
Figure 5A:
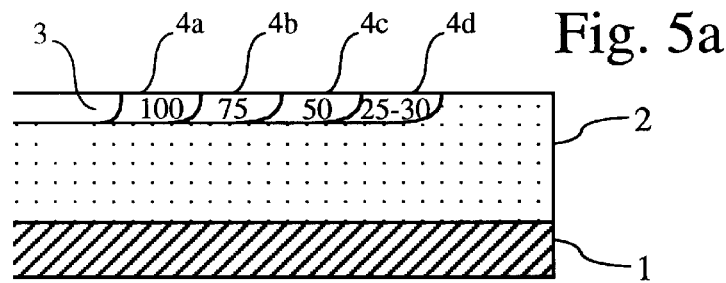
Figure 5B:
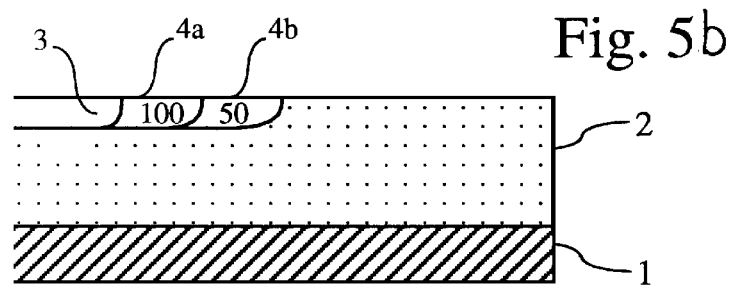
FIG. 5b and FIG. 5c show the same relation for a two-zone JTE and a one-zone JTE respectively.
Figure 5C:
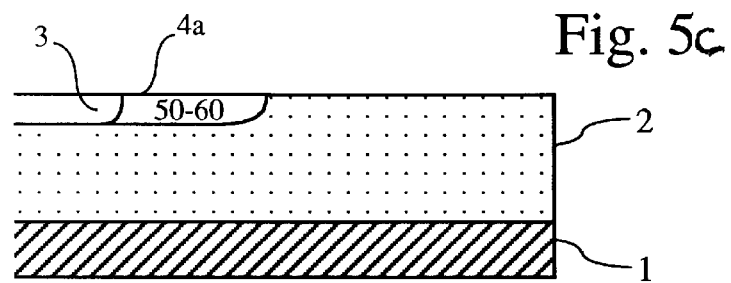

The semiconducting pn junction of FIG. 1 is, as an example, processed on a substrate of SiC consisting of a highly doped (n$^+$) n-conducting layer 1 and on top of said layer a lower doped first, n-conducting, layer 2. These two n-conducting layers 1, 2 compose a planar wafer of the first conducting type, according to the example n-conducting, on which one or more pn junctions according to the invention can be built. In a second stage a p-conducting highly doped second layer 3 is formed on the wafer by means of ion implantation technique, where e. g. Aluminium, Boron or Gallium could be used as implants. At the next stage the extension of layer 3 is defined by means of masking and ion implantation. FIG. 4d shows the first step of forming the JTE, where the entire area of the junction including the prospective JTE is implanted by a type of the suggested ions up to a dose needed to establish the charge content and/or the effective sheet charge density of the outermost zone, in this example, said charge of zone 4d. The surface of the wafer outside the termination edge 5 is masked during this implantation step by a mask 10. At the next stage the mask 10 is extended to cover also the outermost zone 4d of the JTE, whereupon an implantation is carried out of the exposed area comprising the anode and all the JTE zones uncovered with the dose wanted of the next to the outermost JTE zone, in this case zone 4c, to arrive at the charge content and/or the effective sheet charge density of said zone, this step being shown in FIG. 4c. The implantation procedure is repeated in this way until all JTE zones 4a–4d have been implanted, the steps of the procedure being illustrated in FIGS. 4a–4d.

The JTE of FIG. 1 may be processed in another way, where the self-aligned implantation of the zones establishing the JTE is accomplished by a reverse procedure with the one outlined. In this case a mask 10 is covering the area outside the anode, which may be implanted as a first step. As the second step the mask is removed from the area, where the first JTE zone 4a is to be established, whereupon an implantation of the wanted implant is once again carried out. In this way, the area of the surface of the device is increased in steps and exposed to implantation such that zones 4a–4d in the lateral direction outwards from the anode are formed having stepwise decreasing charge densities. The mask 10 may be etched away step by step, or as an alternative the mask may be removed and the device remasked for each process step. The process is illustrated by FIGS. 4a to 4d in succession.

In both methods described above the anode 3 may preferably be masked and not implanted during the processing of the JTE zones.

In a preferred embodiment the effective sheet charge density of each JTE zone 4a–4d is expressed by the relation

Q1:Q2:Q3:Q4=100:75:50:25–30 where $Q_1$ denotes the effective sheet charge density of the innermost zone of the JTE, $Q_2$ the next to the innermost zone 4b and so on. The value 100 denotes the charge density in the zone with the highest doping in the JTE with a four zone embodiment. The value 100 also corresponds to a doping such that the zone with this charge density is completely depleted at full design voltage. This charge density is called the characteristic charge density $Q_0$ and is expressed in Coulombs/cm$^2$.

For a two zone JTE the relation is expressed as Q1:Q2= 100:50, while the effective sheet charge density of a one, zone JTE is ·50–60% of the characteristic sheet charge density $Q_0$.

These listed values for the sheet charge densities of the different zones of the JTE are preferred values. Generally for a four zone JTE the charge densities may be varied according to the intervals of the relation

Q1:Q2:Q3:Q4=100:(60–85):(40–60):(15–40)

With other alternative number of zones:

three zones: Q1:Q2:Q3=100:(50–85):(25–60)

two zones: Q1:Q2=100:(40–60)

one zone: Q1=(40–70)

Figure 6A:
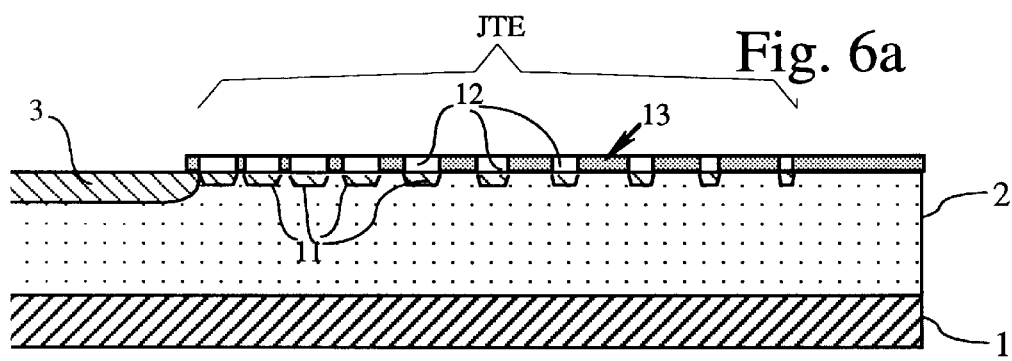
FIG. 6a shows a radial cross section of an example of a JTE established by use of a masking and implantation procedure (method 3°), where the mask is designed to give rise to a decrease in the fraction of the area of the implanted zones per JTE unit area of the junction counted in the direction radially towards the edge of the termination.
Figure 6B:
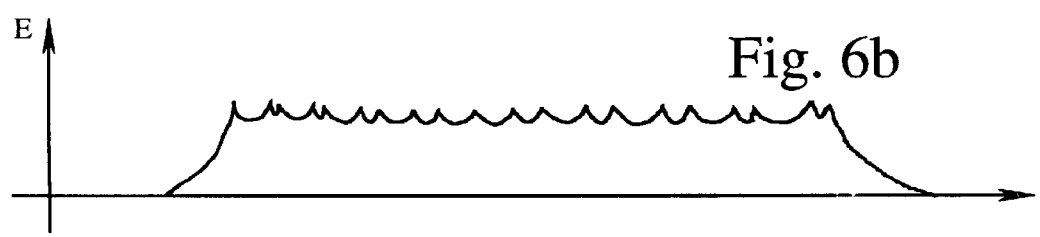

Another embodiment of a semiconductor having a JTE according to the invention is shown in FIG. 6a. A radial cross section through a pn junction of an SiC semiconductor showing a profile of the JTE of said junction is illustrated. The structure of the pn junction is of the same type as discussed above in relation to FIG. 1. In this case, however the JTE has a different structure. On top of the lower doped n-conducting layer 2 an anode formed by a second, highly doped, (p$^+$) p-conducting layer 3 is arranged facing the surface of the wafer, thus establishing a planar surface of the wafer. The first n-conducting layer 2 and the second, p-conducting, layer 3 compose a pn-junction, where the interface between the first, n-conducting, layer 2 and the second, p-conducting, layer 3 define the working area of the pn-junction. Surrounding the pn junction is a JTE comprising a number of spots 11 being of the same conducting type as layer 3 of the pn junction. The effective surface charge density in charge per cm$^2$ given by these spots 11 is decreasing in the direction outwards from the pn junction to the edge 5 of the JTE. This may be achieved in different ways. The areas of the spots may be smaller towards the edge or as another example, the distance between the spots may be greater towards the edge 5, the dictance between the spots may be greater towards the edge 5, the charge content of the spots can be varied or a combination of these different measures applied. All measures taken with the aim of approximating an effective surface charge profile resulting in a desired flat electric field distribution along the extended termination. FIG. 6b shows an example of the electric field distribution in the lateral direction over the JTE profile.

The processing of the JTE of the embodiment shown in FIG. 6a is accomplished in a way similar to the earlier disclosed methods 1° and 2°. As an example, the semiconductor is processed on a substrate of SiC consisting of a highly doped (n$^+$), n-conducting, layer 1 and on top of said layer a lower doped first, n-conducting, layer 2. These two n-conducting layers 1, 2 compose a planar wafer of the first conducting type, according to the example n-conducting, on which one or more pn junctions according to the invention can be built. In a second stage a p-conducting high doped second layer 3 is formed on the wafer by means of ion implantation technique, where e. g. Aluminium, Boron or Gallium could be used as implants. At the next stage a mask (13) with a design defining the areas and positions of the spots 11 by means of holes (12) is arranged on the wafer such that the mask (13) is covering the areas of the prospective JTE between the spots. The wafer is then implanted by a type of the suggested ions up to a dose needed to establish the wanted charge content of the spots exposed to the radiation. The surface of the wafer outside the termination edge 5 is masked during this implantation step. Preferably the implantation is carried out in one step, but several steps of implantation are, of course, also possible. An annealing step following the implantation of the zones on the will create an even better distribution of the charges between the implanted spots. For example using Boron as an implant, to utilize the benefit of a small occuring diffusion is a way to further improve the process.

A relatively smoothly varying surface charge profile can be obtained by this method, where a charge profile with the flat distribution of the electric field at the surface as shown in FIG. 6b is achieved.

The implantation performed to achieve the object of the invention during the different steps is such that damage to the SiC crystal structure is avoided.

We claim:

1. A planar silicon carbide component, comprising:
   a silicon carbide substrate;
   a first low doped layer of a first conductivity type at a surface of the substrate;
   a second higher doped layer of a second conductivity type on the first layer, where the second layer is laterally surrounded by a portion of the first layer, and the first layer and the second layer constitute a pn junction; and
   an edge termination region between the second layer and said portion of the first layer, where the edge termination region, including at least one zone of the second conductivity type, comprises decreasing total charge of the second conductivity type towards an outer border of the edge termination region and where an effective sheet charge density of an innermost zone at most is equal to a characteristic sheet charge density $Q_0$ corresponding to a doping level such that the zone is completely depleted at full design voltage.

2. The component according to claim 1, wherein the edge termination region includes a plurality of zones and encloses a decreasing sheet charge density toward the outer border of the edge termination region and the zones contact each other.

3. The component according to claim 2, wherein the edge termination region includes one zone having an effective sheet charge density of 40–70, where the value 100 corresponds to the characteristic sheet charge density $Q_0$.

4. The component according to claim 2, wherein the edge termination region includes two zones, the effective sheet charge density relationship of said zones is 100:(40–60), where the value 100 corresponds to the characteristic sheet charge density Q.

5. The component according to claim 2, wherein the edge termination region includes three zones, the effective sheet charge density relationship of said zones is 100:(50–85):(25–60), where the value 100 corresponds to the characteristic sheet charge density $Q_0$.

6. The component according to claim 1, wherein the edge termination region includes a plurality of discrete zones of the second conductivity type, where said zones decrease in area toward the outer edge of the edge termination region.

7. The component according to claim 1, wherein the edge termination region includes a plurality of discrete zones of the second conductivity type, a distance between said zones increasing toward the outer edge of the edge termination region.

8. The component according to claim 1, wherein the edge termination region includes a plurality of discrete zones of the second conductivity type, where the total charge of said zones decreases toward the outer edge of the edge termination region.

9. The component according to claim 1, wherein the edge termination region includes a plurality of discrete zones of the second conductivity type, where the effective sheet charge density of said zones decrease toward the outer edge of the edge termination region.

10. A planar silicon carbide component, comprising:

a silicon carbide substrate;

a first low doped layer of a first conductivity type at a surface of the substrate, and a second higher doped layer of the second conductivity type on the first layer, where the second layer is laterally surrounded by a portion of the first layer and the first layer and the second layer constitute a pn junction;

an edge termination region between the second layer and said portion of the first layer, where the edge termination region, including at least one zone of the second conductivity type, comprises decreasing total charge of the second conductivity type towards an outer border of the edge termination region and where an effective sheet charge density of an innermost zone is at most equal to the characteristic sheet charge density $Q_0$ corresponding to a doping level such that the zone is comletely depleted at full design voltage;

said planar silicon carbide component being obtained by a process including the steps:

providing a silicon carbide wafer comprising the lower doped layer of the first conductivity type and the higher doped layer of the second conductivity type and a higher dope(d layer of the second conducting type at a portion of the first layer laterally surrounded by the first layer, masking an area of the wafer not to be implanted adjacent a prospective first zone, and implanting an exposed area of the wafer with an implant at a dose at most corresponding to a characteristic sheet charge density $Q_0$ corresponding to a doping level such that the zone is completely depleted at full design voltage, thus forming a first zone of the second conductivity type.

11. The component according to claim 10, obtained by a process further including the steps:

demasking step by step consecutive areas adjacent the first zone, and implanting the demasked areas after each demasking step for forming consecutive zones of the edge termination region with decreasing total charge towards the outer border of the edge termination region.

12. The component according to claim 11, obtained by a process, wherein an implant used to form p-conducting type zones of the edge termination region is Aluminum, Boron or Gallium, while an implant used to form n-conducting type zones of the termination region is Nitrogen.

* * * * *

UNITED STATES PATENT AND TRADEMARK OFFICE
CERTIFICATE OF CORRECTION

PATENT NO. : 6,002,159
DATED : December 14, 1999
INVENTOR(S) : Bakowski et al.

It is certified that error appears in the above-identified patent and that said Letters Patent is hereby corrected as shown below:

Column 8, line 46, change "Q" to --$Q_0$--.

Column 9, line 14, delete "i".

Column 10, line 2, change "dope(d layer..." to --doped (layer...--.

Signed and Sealed this

Twelfth Day of September, 2000

Q. TODD DICKINSON

*Attest:*

*Attesting Officer*    *Director of Patents and Trademarks*